(12) United States Patent
Lee et al.

(10) Patent No.: US 6,411,124 B2
(45) Date of Patent: Jun. 25, 2002

(54) PROGRAMMABLE LOGIC DEVICE LOGIC MODULES WITH SHIFT REGISTER CAPABILITIES

(75) Inventors: Andy L. Lee, San Jose; Brian Johnson, Sunnyvale; Richard G. Cliff, Los Altos, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/761,602

(22) Filed: Jan. 16, 2001

Related U.S. Application Data
(60) Provisional application No. 60/200,656, filed on Apr. 28, 2000.

(51) Int. Cl.[7] .............................................. H03K 19/177
(52) U.S. Cl. ......................................... 326/41; 326/101
(58) Field of Search ................................ 326/39–41, 44, 326/47, 49, 101

(56) References Cited

U.S. PATENT DOCUMENTS

| | | | |
|---|---|---|---|
| 5,053,647 A | * 10/1991 | Shizukuishi et al. ........... 326/40 |
| 5,212,652 A | 5/1993 | Agrawal et al. | |
| 5,343,406 A | 8/1994 | Freeman et al. | |
| 5,352,940 A | 10/1994 | Watson | |
| 5,414,377 A | 5/1995 | Freidin ......................... 326/41 |
| 5,432,719 A | 7/1995 | Freeman et al. | |
| 5,488,316 A | 1/1996 | Freeman et al. ............... 326/41 |
| 5,550,782 A | 8/1996 | Cliff et al. ............... 365/230.03 |
| 5,566,123 A | 10/1996 | Freidin et al. .......... 365/230.05 |
| 5,572,148 A | 11/1996 | Lytle et al. .................... 326/41 |
| 5,631,577 A | 5/1997 | Freidin et al. ................. 326/40 |
| 5,648,732 A | 7/1997 | Duncan ......................... 326/40 |
| 5,689,195 A | 11/1997 | Cliff et al. ..................... 326/41 |

(List continued on next page.)

OTHER PUBLICATIONS

U.S. application No. 09/007,718, Zaveri et al., filed Jan. 15, 1998.
U.S. application No. 09/266,235, Jefferson et al., filed Mar. 10, 1999.
P. Chow et al., "A 1.2μm CMOS FPGA using Cascaded Logic Blocks and Segmented Routing", *FPGAs*, Chapter 3.2, pp. 91–102, W.R. Moore and W. Luk (eds.), Abingdon EE&CS Books, Abingdon, (UK), 1991.
L. Mintzer, "FIR Filters with the Xilinx FPGA", FPGA '92 #129–#134.
"Optimized Reconfigurable Cell Array (ORCA) Series Field–Programmable Gate Arrays", Advance Data Sheet, AT&T Microelectronics, Feb. 1993, pp. 1–36 and 65–87.
*The Programmable Logic Data Book,* 1994, Xilinx Inc., San Jose, CA, cover pages and pp. 2–5 through 2–102 ("XC4000 Logic Cell Array Families").

(List continued on next page.)

*Primary Examiner*—Michael Tokar
*Assistant Examiner*—James H. Cho
(74) *Attorney, Agent, or Firm*—Fish & Neave; Robert R. Jackson

(57) ABSTRACT

A logic module for a programmable logic device includes shift register circuitry in addition to the conventional programmable memory cells and look-up table decoder or selection control circuitry. In one embodiment the selection control circuitry can access either the memory cells or the various stages of the shift register. The shift register stages, and preferably the master and slave latches of each shift register stage, are accessed in a Gray code order. All of the stages of the shift register are preferably clearable in parallel. The shift registers of two logic modules are preferably cascadable to facilitate providing longer shift registers. Clock circuitry may be provided to facilitate providing two clock signals that are the logical inverse of one another with a common enable signal.

37 Claims, 8 Drawing Sheets

U.S. PATENT DOCUMENTS

| | | | |
|---|---|---|---|
| 5,758,192 A | | 5/1998 | Alfke |
| 5,889,413 A | | 3/1999 | Bauer .......................... 326/40 |
| 5,898,893 A | | 4/1999 | Alfke |
| 5,905,385 A | * | 5/1999 | Sharpe-Geisler ............. 326/39 |
| 5,926,036 A | | 7/1999 | Cliff et al. ..................... 326/40 |
| 6,049,223 A | | 4/2000 | Lytle et al. .................... 326/40 |
| 6,118,300 A | * | 9/2000 | Wittig et al. .................. 326/41 |

OTHER PUBLICATIONS

B. Klein, "Use LFSRs to Build Fast FPGA–Based Counters", Electronic Design, Mar. 21, 1994, pp. 87, 88, 90, 94, 96, 97, and 100.

A. DeHon, "Reconfigurable Architectures for General–Purpose Computing", M.I.T. Ph.D. thesis, Sep. 1996.

R. Iwanczuk, "Using the XC4000 RAM Capability", XAPP 031.000, Xilinx, Inc., San Jose, CA.

J.R. Hauser et al., "Garp: A MIPS Processor with a Reconfigurable Coprocessor", 0–8186–8159–4/97 $10.00 ©1997 IEEE, pp. 12–21.

A. Ohta et al., "New FPGA Architecture fir Bit–Serial Pipeline Datapath", 0–8186–8900–5/98 $10.00 ©1998 IEEE, pp. 58–67.

"XC4000E and XC4000X Series Field Programmable Gate Arrays; Product Specification", May 14, 1999 (Version 1.6), Xilinx Inc., San Jose, CA, pp. 6–5 through 6–72.

"Flex 10K Embedded Programmable Logic Family", Data Sheet, Jun. 1999, ver. 4.01, Altera Corporation, San Jose, CA, pp. 1–137.

"Flex 10KE Embedded Programmable Logic Family", Data Sheet, Aug. 1999, ver. 2.02, Altera Corporation, San Jose, CA, pp. 1–120.

"XC4000XLA/XV Field Programmable Gate Arrays; Product Specification", DS015 (v1.3) Oct. 18, 1999, Xilinx Inc., San Jose, CA, pp. 6–157 through 6–170.

"Triscend E5 Configurable System–on–Chip Family", Triscend Corporation, Jan. 2000 (Version 1.00) Product Description, cover page and pp. 25–28.

"Apex 20K Programmable Logic Device Family", Data Sheet, Mar. 2000, ver. 2.06, Altera Corporation, San Jose, CA, pp. 1–208.

"Virtex 2.5V Field Programmable Gate Arrays", DS003 (v. 2.0), Preliminary Product Specification, Mar. 9, 2000, Xilinx, Inc., San Jose, CA, pp. 1–72.

"Virtex™–E 1.8V Extended Memory Field Programmable Gate Arrays", DS025 (v1.0) Mar. 23, 2000, Advance Product Specification, Xilinx, Inc., San Jose, CA, pp. 1 and 6.

* cited by examiner

|  |  | D | C | B | A |
|---|---|---|---|---|---|
| MASTER 0 | C0 | 0 | 0 | 0 | 0 |
| SLAVE 0 | C1 | 0 | 0 | 0 | 1 |
| MASTER 1 | C3 | 0 | 0 | 1 | 1 |
| SLAVE 1 | C2 | 0 | 0 | 1 | 0 |
| MASTER 2 | C6 | 0 | 1 | 1 | 0 |
| SLAVE 2 | C7 | 0 | 1 | 1 | 1 |
| MASTER 3 | C5 | 0 | 1 | 0 | 1 |
| SLAVE 3 | C4 | 0 | 1 | 0 | 0 |
| MASTER 4 | C12 | 1 | 1 | 0 | 0 |
| SLAVE 4 | C13 | 1 | 1 | 0 | 1 |
| MASTER 5 | C15 | 1 | 1 | 1 | 1 |
| SLAVE 5 | C14 | 1 | 1 | 1 | 0 |
| MASTER 6 | C10 | 1 | 0 | 1 | 0 |
| SLAVE 6 | C11 | 1 | 0 | 1 | 1 |
| MASTER 7 | C9 | 1 | 0 | 0 | 1 |
| SLAVE 7 | C8 | 1 | 0 | 0 | 0 |

*FIG. 2*

PROGRAMMABLE LOGIC DEVICE LOGIC MODULES WITH SHIFT REGISTER CAPABILITIES

This application claims the benefit of provisional patent application No. 60/200,656, filed Apr. 28, 2000, which is hereby incorporated by reference herein in its entirety.

BACKGROUND OF THE INVENTION

This invention relates to programmable logic devices, and more particularly to the logic modules used in such devices.

Many programmable logic devices include logic modules (also sometimes called logic elements) that are basically programmable look-up tables. See, for example, Cliff et al. U.S. Pat. No. 5,260,611, Cliff et al. U.S. Pat. No. 5,689,195, Cliff et al. U.S. Pat. No. 5,909,126, Jefferson et al. U.S. patent application Ser. No. 09/266,235, filed Mar. 10, 1999, and Ngai et al. U.S. patent application Ser. No. 09/516,921, filed Mar. 2, 2000. It is known to construct such logic modules so that the programmable memory bits and associated circuitry in a module can have other uses, e.g., to provide dynamic memory or shift register capabilities. See, for example, Freeman et al. U.S. Pat. No. 5,343,406, Freidin et al. U.S. Pat. No. 5,566,123, and Bauer U.S. Pat. No. 5,889,413. In some uses of programmable logic devices, however, normal shift registers may have various shortcomings, and rapid clearing of the known shift registers in logic modules may not be convenient or possible.

SUMMARY OF THE INVENTION

In accordance with the present invention the look-up table circuitry in a logic module of a programmable logic device is additionally provided with a separate shift register. The output selection control circuitry of the look-up table (or similar but separate selection control circuitry) is used to select and read out the contents of any desired shift register stage. The shift register stages are preferably coupled to the output selection control circuitry in a pattern which facilitates using a Gray code to read the contents of the shift register. All stages of the shift register are preferably clearable in parallel using a single clear signal. The shift registers in two logic modules may be cascaded together to facilitate the provision of longer shift registers.

Further features of the invention, its nature and various advantages will be more apparent from the accompanying drawings and the following detailed description.

BRIEF DESCRIPTION OF THE DRAWINGS

FIG. 2 is a chart that is useful in explaining certain aspects of the circuitry shown in FIG. 1.

DETAILED DESCRIPTION

Figure 1:
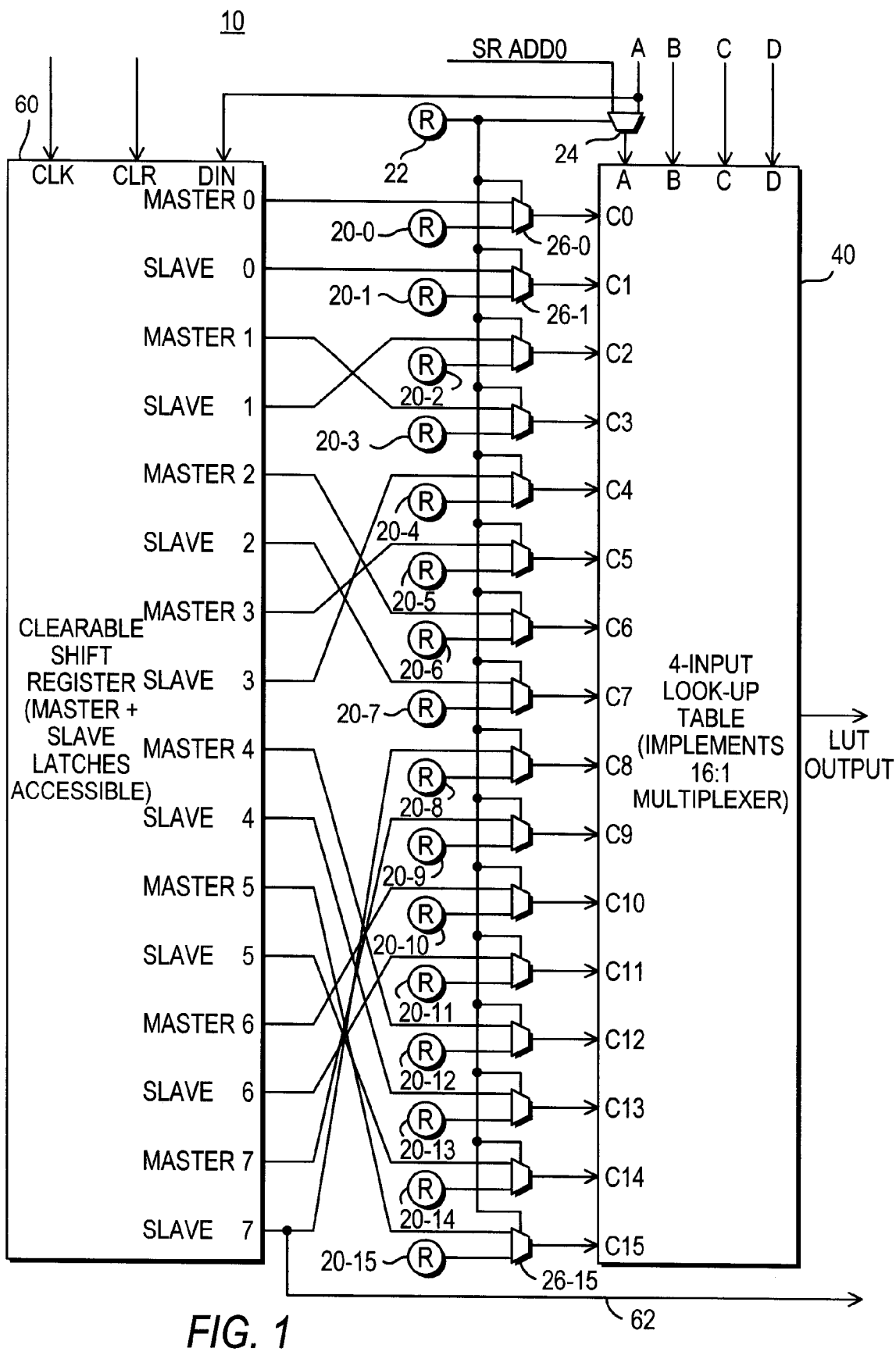
FIG. 1 is a simplified schematic block diagram of an illustrative embodiment of a portion of a representative programmable logic device logic module constructed in accordance with the invention.

As shown in FIG. 1, a portion of an illustrative embodiment of a representative programmable logic module 10 in accordance with the invention includes 16 configurable (i.e., programmable) memory cells or RAM bits 20-0 through 20-15. Logic module 10 also includes selection control circuitry 40 for selecting one of its 16 inputs C0–C15, and outputting a signal ("LUT OUTPUT") indicative of the selected input. Logic module 10 still further includes eight-stage shift register circuitry 60 having eight master latches alternating or interspersed with eight slave latches.

In traditional look-up table mode, programmable function control element ("FCE") 22 is programmed to control programmable logic connector ("PLC") 24 to apply the "A" input signal of logic module 10 to selection control input signal terminal A of circuitry 40. In this programmed state, FCE 22 also controls all of PLCs 26-0 through 26-15 to apply the output signals of memory cells 20 to the C0–C15 data input terminals of selection control circuitry 40. (Memory cells 20 are programmable like FCE 22 and can therefore be alternatively referred to as FCEs 20.) Input signals A–D, applied to selection control input signal terminals A–D of circuitry 40, control which of its 16 input signals C0–C15 circuitry 40 selects as the basis for its LUT OUTPUT signal.

In shift register mode, FCE 22 is programmed to the state opposite to that described above. Accordingly, PLC 24 selects the signal SR ADD0 as the signal to be applied to selection control input signal terminal A of circuitry 40. Similarly, each of PLCs 26 selects an associated one of the MASTER/SLAVE output signals of shift register 60 for application to circuitry 40. The input signal A, which in traditional look-up table mode is applied to selection control input signal terminal A of circuitry 40, is effectively "stolen" for use as the data input signal ("DIN") to shift register circuitry 60. The applied data signal is shifted down through the successive, alternating master and slave latches of circuitry 60 in response to a clock signal applied to the CLK input terminal of circuitry 60. All stages of circuitry 60 can be cleared in parallel by asserting a clear signal applied to the CLR input terminal of circuitry 60.

It will be noted that the 16 latches of shift register circuitry 60 are effectively re-ordered for connection to inputs C0–C15 of selection control circuitry 40. For example, master latch 0 is connected to input C0 and slave latch 0 is connected to input C1, but the next latch (master 1) is connected to C3 rather than to C2, and slave latch 1 (which follows master 1) is connected to C2. The re-ordering becomes even more pronounced for subsequent shift register stages. For example, master 2 is connected to C6, slave 2 is connected to C7, master 3 is connected to C5, slave 3 is connected to C4, and so on. This re-ordering is preferably such that a "Gray code" progression of the signals applied to input terminals A–D of circuitry 40 will cause circuitry 40 to select the outputs of the shift register latches in shift register order. This use of Gray code is helpful in many applications, such as efficient implementation of firstin-first-out ("FIFO") memories. (The reference number 70 is used in FIG. 1 for the connections from circuitry 60 to circuitry 40.)

The above-mentioned Gray code ordering is further illustrated by FIG. 2, which shows shift register order of the shift register latches in the left-hand column, the C0–C15 input terminal to which each shift register latch is connected in the next-to-left-most column, and in the four remaining columns the A–D signal values that cause selection of each C0–C15 input. The progression of A–D signals from top to bottom in FIG. 2 (and even looping back from bottommost to topmost) is a Gray code sequence because only one bit position changes in value in going from any selection to the next successive selection. For example, to go from selection of master 0 (C0) to slave 0 (C1), only the value of the A input changes. Similarly, to go from selection of slave 4 (C13) to master 5 (C15), only the value of the B input changes. This property of a Gray code works in either direction (i.e., whether one is progressing up or down in FIG. 2). For example, to go either up or down from master 6 (C10) requires changing the value of only one of inputs A–D (in particular, to go down from master 6 to slave 6 (C11), only the value of input A changes; and to go up from master 6 to slave 5 (C14) only the value of input C changes).

The particular pattern of connections between circuitries 60 and 40 shown in FIG. 1 and tabularized in FIG. 2 assumes that circuitry 40 is a binary-coded selection circuit (i.e., that binary coded values of A–D (with A being the least significant (or low order) bit) select respective inputs C0–C15). Thus inputs A–D with a binary-coded, aggregate decimal value of 0 select input C0; inputs A–D with a binary-coded, aggregate decimal value of 1 select input C1; inputs A–D with a binary-coded, aggregate decimal value of 2 select input C2; and so on. If the internal organization of circuitry 40 is different than that described above, then the pattern of connections between the outputs of circuitry 60 and the inputs of circuitry 40 may be different than the pattern shown in FIG. 1 and tabularized in FIG. 2, although it will preferably still be such as to allow successive shift register outputs to be selected by Gray code inputs A–D. It should also be noted that the particular Gray code shown in FIG. 2 is only one example of many possible Gray codes, and that if a different Gray code is used, the pattern of connections between circuitries 60 and 40 may be different to conform to that different Gray code.

Figure 3:
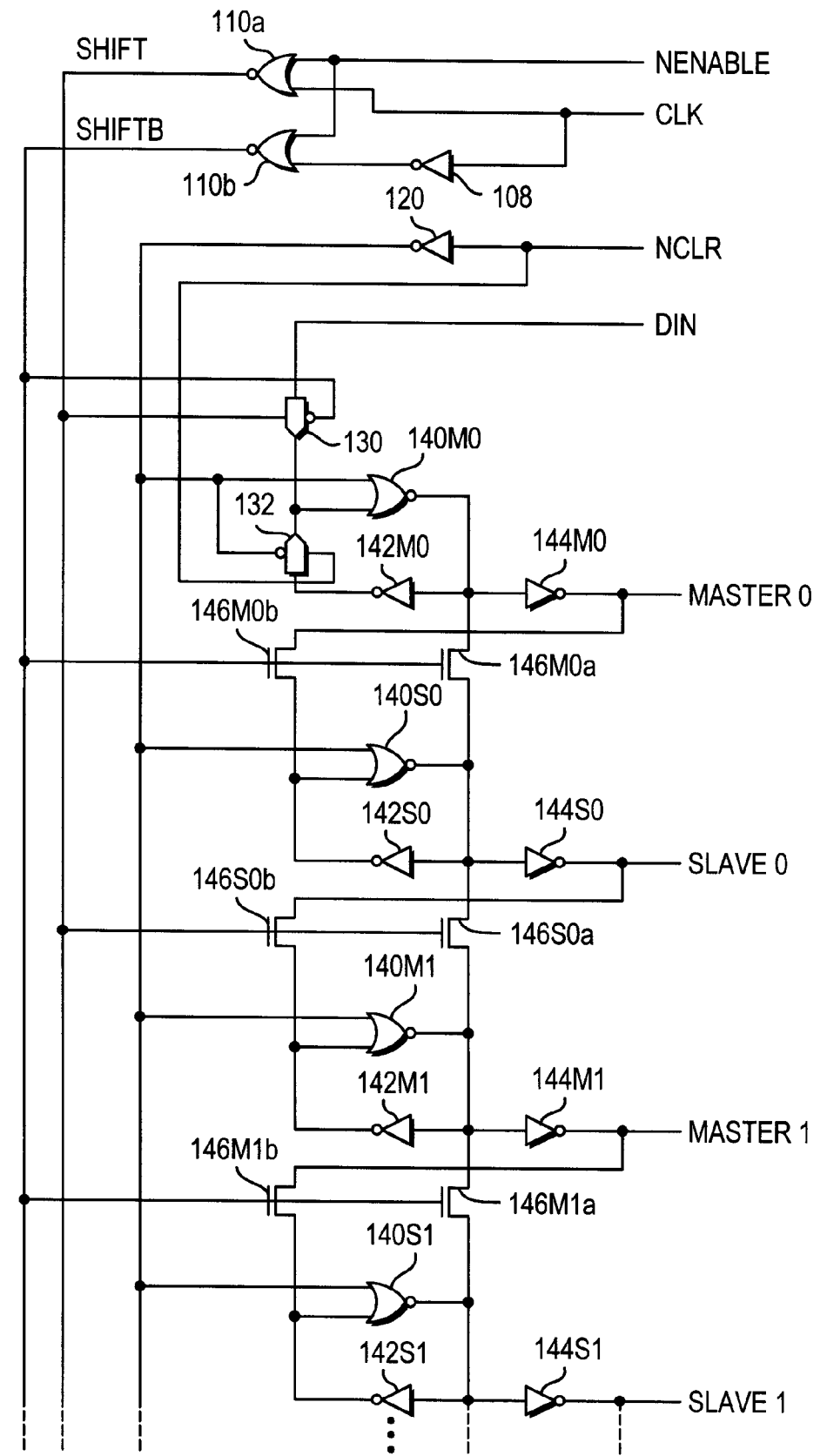
FIG. 3 is a simplified schematic block diagram showing in more detail an illustrative embodiment of a representative portion of the circuitry shown in FIG. 1.

FIG. 3 shows an illustrative embodiment of a representative portion of shift register circuitry 60 in more detail. When the NENABLE signal is logic 0, NOR gates 110*a* and 110*b* are both enabled to pass the clock signals applied to their other input terminals. In particular, enabled NOR gate 110*a* outputs a clock signal which is the inverse of the applied CLK signal, and enabled NOR gate 110*b* outputs a clock signal which is the same as the applied CLK signal (because of the effect of inverter 108). The output signal of NOR gate 110*a* is sometimes referred to as a SHIFT signal, and the output of NOR gate 110*b* is sometimes referred to as the SHIFTB signal. The immediately following discussion assumes that SHIFT and SHIFTB are determined by the CLK signal. The immediately following discussion also assumes that the clear signal NCLR is logic 1 to prevent clearing of shift register circuitry 60.

When the SHIFT signal is logic 1 and SHIFTB is logic 0, pass gate 130 is enabled to apply the data input signal DIN to one input terminal of NOR gate 140M0. NOR gate 140M0 is enabled to pass this signal (with logical inversion) because the signal applied to its other input terminal is logic 0 (because NCLR is assumed to be logic 1 and inverter 120 inverts that signal). The output signal of NOR gate 140M0 is inverted by inverter 142M0 and fed back via pass gate 132 to the same node that receives the DIN signal from pass gate 130. (Pass gate 132 is enabled because the NCLR signal is logic 1 and its inverse (produced by inverter 120) is logic 0.) Inverter 142M0 is not strong enough to over-ride the DIN signal passed by pass gate 130. Accordingly, the output signal of inverter 142M0 immediately conforms to the DIN signal. When pass gate 130 is subsequently disabled by the CLK signal causing the states of SHIFT and SHIFTB to reverse, inverter 142M0 is strong enough to hold the output node of pass gate 130 in the logical state that it was last driven to by DIN. Accordingly, that DIN signal value is latched into the first master latch (including elements 140M0 and 142M0) of shift register circuitry 60. Inverter 144M0 inverts the output signal of NOR gate 140M0 for application to the MASTER 0 output terminal. Accordingly, the uninverted DIN signal value is available as the MASTER 0 output signal.

The SHIFT/SHIFTB signal state that turns off pass gate 130, turns on transistors 146M0*a* and 146M0*b*. In particular, when SHIFTB becomes logic 1, pass gate 130 is turned off, the master 0 latch of shift register circuitry 60 latches in the most recent value of DIN, and transistors 146M0 are both turned on. When thus turned on, transistor 146M0*a* applies the output signal of NOR gate 140M0 to the input terminal of inverter 142S0, and transistor 146M0*b* applies the output signal of inverter 144M0 to the lower input terminal of NOR gate 140S0. NOR gate 140S0 (like all of NOR gates 140 in FIG. 3) is enabled by the inverted NCLR signal to pass, with inversion, the signal applied to its lower input terminal. Inverter 142S0, which is connected in closed loop feedback series with NOR gate 140S0 (via the lower input terminal of that NOR gate) is not strong enough to prevent the signals applied via transistors 146M0*a* and 146M0*b* from causing the lower input node and the output node of the NOR gate to conform to those transistor signals. Accordingly, when transistors 146M0*a* and 146M0*b* are enabled, the data value stored in master latch 0 (elements 140M0 and 142M0) transfers to slave latch 0 (elements 140S0 and 142S0). When transistors 146M0*a* and 146M0*b* are subsequently turned off (by SHIFTB switching to logic 0), inverter 142S0 is strong enough to maintain the lower input and the output of NOR gate 140S0 in the states to which they were driven by the signals from the master 0 latch. Accordingly, the data value transferred from the master 0 latch is now latched into slave latch 0. The output signal of NOR gate 140S0 is output via inverter 144S0 as the SLAVE 0 output signal of shift register circuitry 60.

Transfer of the data value from the slave 0 latch to the master 1 latch is similar to that described above for transfer from the master 0 latch to the slave 0 latch, except that it occurs during the other phase of the CLK signal cycle. This is so because, whereas transistors 146M0*a* and 146M0*b* are enabled when SHIFTB is logic 1, transistors 146S0*a* and 146S0*b* are enabled when SHIFT is logic 1, and SHIFT and SHIFTB are logic 1 during the two, mutually exclusive, different phases of the CLK signal. Also, while data is shifting from slave latch 0 to master latch 1, master latch 0 is again enabled to receive the next data value DIN because pass gate 130 is enabled by the same state of the SHIFT/SHIFTB signals that turns on transistors 146S0*a* and 146S0*b*.

The shifting and latching operation of all the remaining stages of shift register circuitry 60 is similar to what has now been described. In particular, each master latch receives and stores data from DIN or the preceding slave latch when SHIFT is logic 1 and SHIFTB is logic 0, and each slave latch receives and stores data from the preceding master latch when SHIFT is logic 0 and SHIFTB is logic 1.

During the time interval when the master latches are receiving data, each master latch and the preceding slave latch are both outputting exactly the same signals (e.g., the MASTER 1 output signal is the same as the SLAVE 0 output signal, there being preferably not even any difference due to logical inversion between these two signals). Similarly, during the time interval when the slave latches are receiving data, each slave latch and the preceding master latch are both outputting exactly the same signals (e.g., the SLAVE 1 output signal is the same as the MASTER 1 output signal, again preferably with no logical inversion between these signals).

The ability to read the same data from either of two adjacent shift register latches, and the fact that shifting within circuitry 60 is faster than decoding by circuitry 40, can help ease timing constraints associated with using the shift register. This is useful when implementing first-in/first-out ("FIFO") memories using this shift register. See commonly assigned, concurrently filed U.S. patent application Ser. No. 09/761,609.

Although the above discussion shows that all 16 latches of shift register circuitry 60 are readable via circuitry 40, in many applications it may instead be desired to read only one of each master/slave pair (e.g., just the slave latch of each pair). This can, of course, be done by supplying only the addresses A–D of the type of latch (either master or slave) that it is desired to read. Shift register circuitry 60 then functions as an eight-bit-maximum shift register.

Note that shifting of data through shift register circuitry 60 can be stopped at any time by causing the NENABLE signal (FIG. 3) to become logic 1, thereby causing NOR gates 110a and 110b to block the CLK signal.

All stages of shift register circuitry 60 can be cleared in parallel by causing the NCLR signal to become logic 0. This causes logic 1 to be applied to the upper input terminal of each of NOR gates 140. This forces the output of each NOR gate 140 to logic 0, thereby over-riding any other data stored in the latch including that NOR gate. Pass gate 132 is also disabled.

Figure 4:
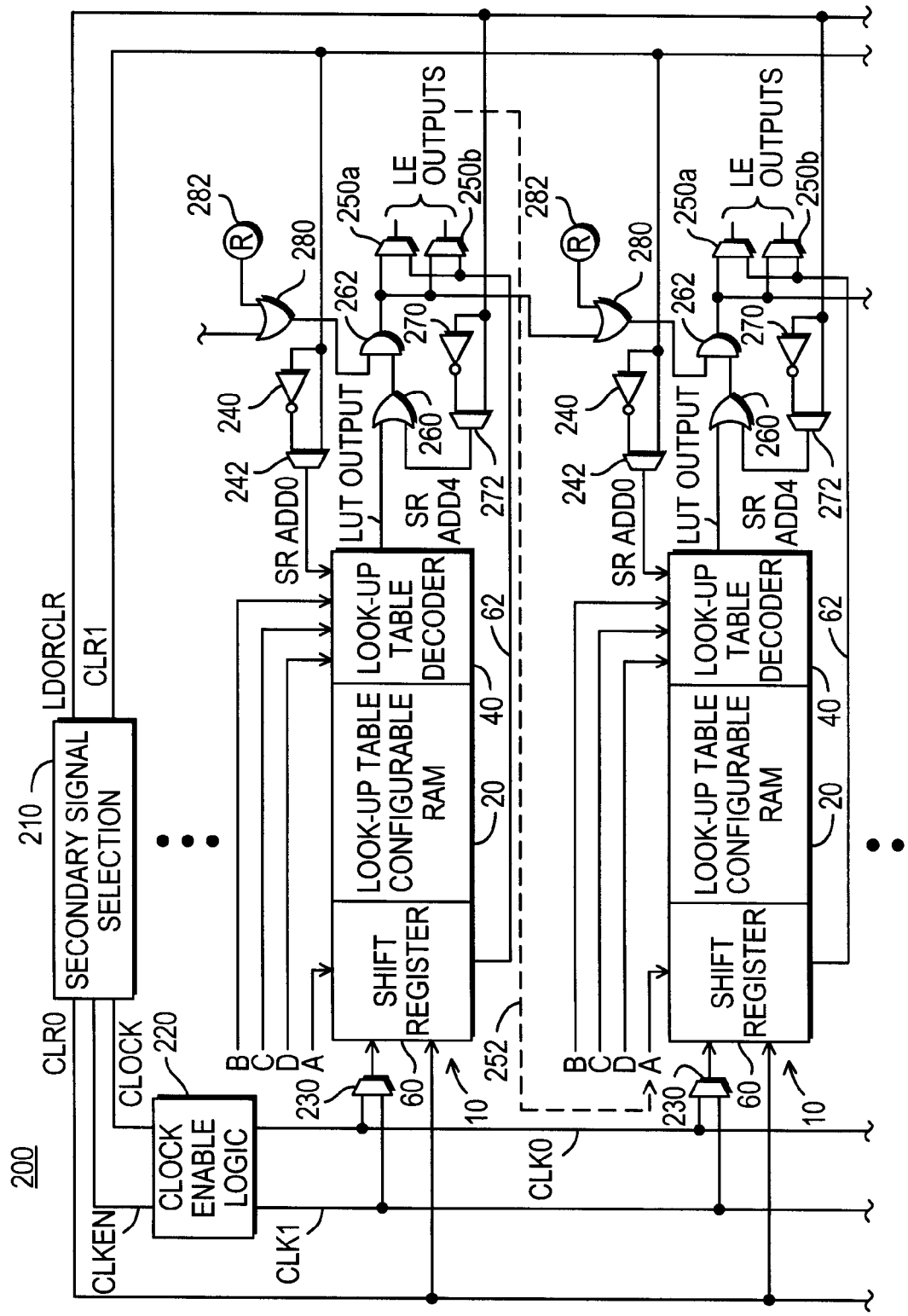
FIG. 4 is a simplified schematic block diagram of an illustrative embodiment of programmable logic device circuitry that includes multiple instances of circuitry of the type shown in FIG. 1 in accordance with the invention.

FIG. 4 shows circuitry that can be provided to facilitate use of the shift register capabilities of two logic modules to produce a longer shift register. The circuitry of two representative logic modules 10 is shown in FIG. 4. In addition, some other circuitry associated with the group or block 200 of logic modules that includes the depicted modules is shown in FIG. 4. This other circuitry, which is shared by all the logic modules in block 200, includes secondary signal selection circuitry 210 and clock enable logic 220. Secondary signal selection circuitry 210 is typically programmable circuitry for selecting control signals like clock and clear signals for use by block 200. Circuitry 210 may select these signals from any of several sources such as clock or other "fast" signal conductors that extend throughout the programmable logic device, or from other sources such as the general interconnect resources of the programmable logic device. FIG. 4 shows circuitry 210 outputting two clear signals (CLR0 and CLR1), a load or clear signal (LDORCLR), a clock signal (CLOCK), and a clock enable signal (CLKEN). These are only illustrative of the signals and signal types that circuitry 210 may output, and other generally similar signals may be alternatively or additionally output. In general, the signals output by circuitry 210 are shared by all of the logic modules 10 in block 200.

The clock and clock enable signals output by circuitry 210 are used by clock enable logic 220 to produce two actual clock signals (CLK0 and CLK1). Each of logic modules 10 includes a PLC 230 for selecting one of these clock signals as the clock signal used by the shift register 60 of that logic module (i.e., the CLK signal shown in FIGS. 1 and 3). The CLR0 signal is applied to the shift register 60 of each logic module (i.e., as the CLR signal in FIG. 1, which corresponds functionally to the NCLR signal in FIG. 3). The CLR1 signal in FIG. 4 is used as the source of the SR ADD0 signal in FIG. 4 (see also FIG. 1). In particular, each logic module 10 in FIG. 4 has programmable invert circuitry (including inverter 240 and PLC 242) for allowing the SR ADD0 signal of that logic module to be either the true or complement of the CLR1 signal. This capability is provided for the following reason: In a Gray code shift register (as opposed to a binary code shift register) the slave latch addresses do not all end in 0. For this reason, programmable invert 240/242 can be used to modify the block-200-wide low-order address at each logic module 10 so that different logic modules in the same block 200 can be configured as different length shift registers. With reference to FIG. 2, for example, a six-bit shift register ends with a slave latch (slave 6) having a low-order address (A) of 1, while a five-bit shift register ends with a slave latch (slave 5) having a low-order address (A) of 0. Assuming that the CLR1 signal holds a low value in shift register mode, a logic module 10 that is being used to provide a five-bit shift register will have its programmable invert 240/242 programmed to invert the CLR1 signal. A logic module 10 that is being used to provide a six-bit shift register will not invert the CLR1 signal.

The circuitry shown in FIG. 4 also includes elements that facilitate use of two logic modules 10 to provide a shift register having more than eight bits (or more than 16 latches). For example, if the two logic modules 10 shown in FIG. 4 are to be used together to provide a shift register longer than eight bits, the upper logic module may provide the first eight bits. One of the PLCs 250 associated with the upper logic module is programmed to output the slave 7 latch output signal 62 (see also FIG. 1) of the upper logic module. (It should be noted that each slave 7 latch output signal 62 is available to the associated PLCs 250 without use of the associated look-up table decoder or selection circuitry 40. In other words, the final slave latch output signal 62 is available in parallel with the normal LUT OUTPUT signal.) This PLC 250 output is routed (e.g., via the programmable interconnect resources of the programmable logic device (indicated by dotted line 252)) to the A input of the lower logic module for shifting into the shift register portion 60 of that logic module. The appropriate extended shift register stage is read out using the look-up table decoder of lower logic module 10. For example, if an extended shift register having ten stages is desired, the upper logic module 10 provides the first eight stages and the lower logic module 10 provides the final two stages. Thus the second slave latch (slave 1) of the lower logic module is read out to provide a LUT OUTPUT signal which is the end-point signal of a ten-bit shift register. The normal LUT OUTPUT of the upper logic module can still be used (i.e., by passing it out through the associated OR gate 260, the associated AND gate 262, and the one of the associated PLCs 250 that is not being used to output the signal on the associated lead 62. This feature is useful for implementing Linear Feedback Shift Registers ("LFSRs").

Another feature of the circuitry shown in FIG. 4 is the ability to use a block-200-wide signal as what is effectively a fifth address signal (SR ADD4) to select between two cascaded LUT OUTPUT signals. This block-wide fifth address signal is the LDORCLR signal, which is programmably invertable by each logic module 10 using elements 270 (an inverter) and 272 (a PLC) associated with that logic module. For example, if a logic module does not invert the LDORCLR signal, the OR gate 260 associated with that logic module blocks the LUT output signal of the logic module while the LDORCLR signal is logic 1, and passes the LUT output signal while the LDORCLR signal is logic 0. On the other hand, if the logic module inverts the LDORCLR signal, the associated OR gate 260 passes the LUT output signal while the LDORCLR signal is logic 1, and blocks it while the LDORCLR signal is logic 0. Each AND gate 262 receives the output signal of the associated OR gate 260 and the output of the AND gate 262 of the logic module above (if the intervening OR gate 280 is enabled by the associated PLC 282). Thus, if the programmable invert elements 270/272 of two adjacent logic modules are programmed so that one logic module inverts the LDORCLR signal and the other logic module does not invert the LDORCLR signal, the state of the LDORCLR signal can be used to determine which of the LUT OUTPUT signals of those two logic modules passes out through the AND gate 262 that can receive either of those signals. On the other hand, if both OR gates are passing their respective LUT OUTPUT signals (because both logic modules are programmed to apply the same logic 0 SR ADD4 signal to their OR gates 260), then the AND gate 262 receiving both of those OR gate 260 signals logically combines those signals as in a conventional cascade chain.

Note that the above-described fifth address bit feature allows the addressing of all 32 latches in a cascaded 16-bit shift register formed from two adjacent logic modules 10 and with no additional logic module(s) being required to provide this capability. This feature is useful for implementing efficient FIFO memories.

Figure 5:
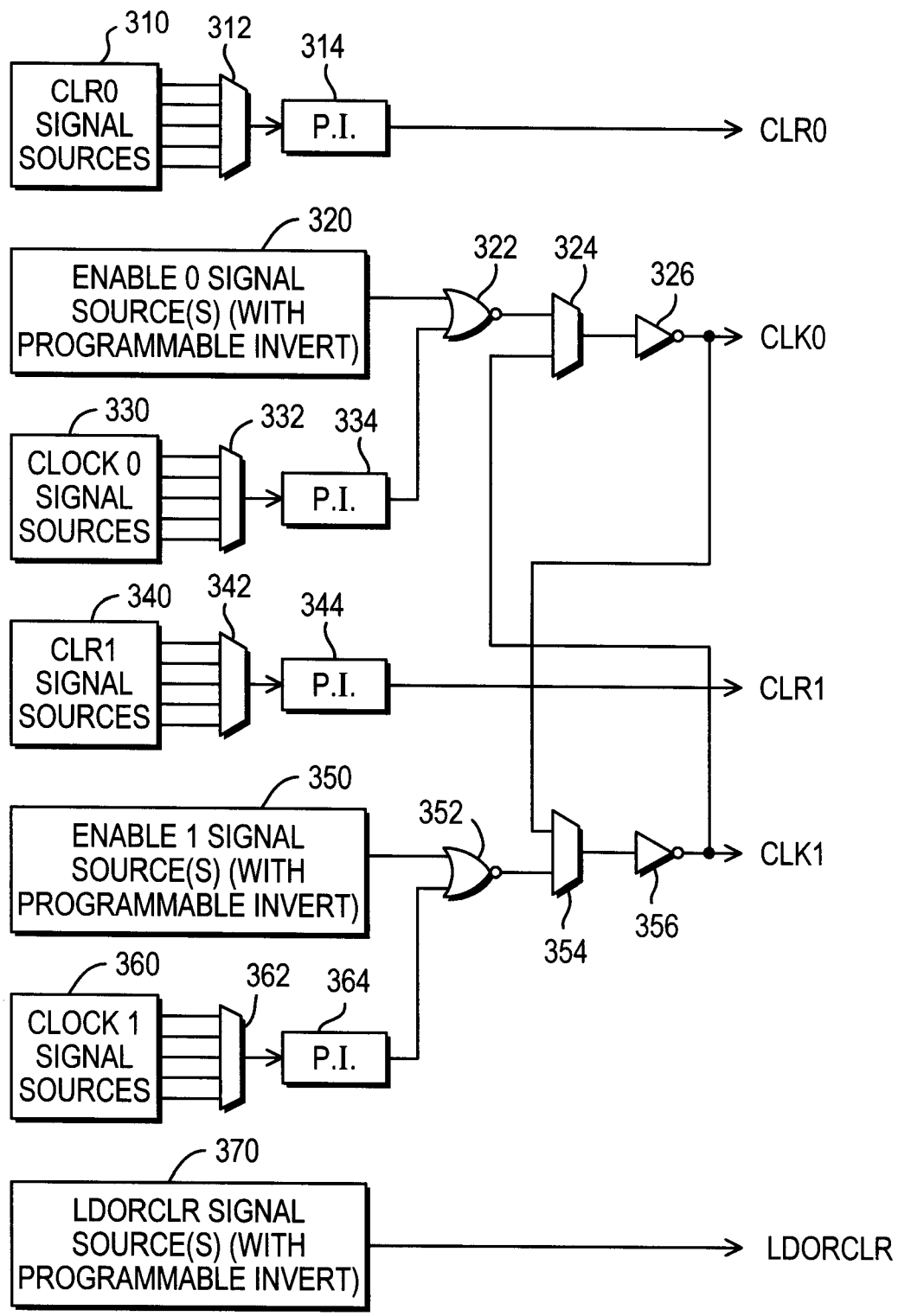
FIG. 5 is a simplified schematic block diagram of an illustrative embodiment of a portion of the circuitry shown in FIG. 4.

FIG. 5 shows additional details of a preferred embodiment of circuitry 210/220 in FIG. 4. In the embodiment shown in FIG. 5 circuitry 210/220 includes several possible sources 310 for the CLR0 signal. Examples of suitable sources are any of several so-called fast conductors for distributing signals relatively widely throughout the programmable logic device and one of the inputs to the block 200 of logic modules 10 served by circuitry 210/220. PLC 312 selects a signal from any desired one of sources 310, and programmable invert circuitry 314 inverts that signal (if desired) to produce the CLR0 signal. (Programmable invert circuitry 314 and other similar circuitries may be similar to elements like 240/242 in FIG. 4.)

Circuitry 210/220 also includes one or more ENABLE 0 signal sources (with programmable invert capabilities). For example, one of the inputs to the block 200 of logic modules 10 served by circuitry 210/220 may be a source for the ENABLE 0 signal. Several sources 330 for a CLOCK 0 signal are also included in circuitry 210/220. Examples of CLOCK 0 signal sources are inputs to the logic module block 200 served by circuitry 210/220, several dedicated clock signals on the programmable logic device, and the above-mentioned fast signal conductors. PLC 332 selects the signal from one of sources 330, and programmable invert circuitry 334 inverts that signal if desired. The ENABLE 0 signal and the CLOCK 0 signal are respectively applied to the two input terminals of NOR gate 322. Accordingly, NOR gate 322 passes the CLOCK 0 signal when enabled by the ENABLE 0 signal.

The elements of FIG. 5 that have been described thus far are substantially repeated in elements 340, 342, 344, 350, 352, 360, 362, and 364. Similar, but preferably (to at least some extent) different, signal sources are associated with elements 340, 350, and 360. Thus the CLR1 signal can be different than the CLR0 signal, and the CLOCK 1 output signal of NOR gate 352 can be different from and have a different enabling condition than the CLOCK 0 output signal of NOR gate 322. The circuitry of FIG. 5 also includes one or more sources 370 for the LDORCLR signal, preferably including programmable invert capabilities.

The CLOCK 0 output signal of NOR gate 322 is applied to one input terminal of PLC 324. The output signal of PLC 324 is applied to inverter 326. The CLOCK 1 output signal of NOR gate 352 is similarly applied to one input terminal of PLC 354, and the output signal of PLC 354 is applied to inverter 356. The output signal of inverter 326 is the other input to PLC 354, and the output signal of inverter 356 is the other input to PLC 324. This circuitry allows the CLK0 and CLK1 signals to be the logical inverse of one another, to have the same ultimate clock signal source (CLOCK 0 or CLOCK 1), and to have the same enable (ENABLE 0 or ENABLE 1). This feature is useful for implementing efficient FIFO memories. Alternatively, CLK0 and CLK1 can be independent clock signals with independent enables.

When a logic module 10 is being used as a shift register, there should be no need to also use the register (not shown) that is conventionally provided for optionally registering the LUT OUTPUT signal. Accordingly, to reduce the number of FCEs that must be added to control the shift register function, the FCEs provided for control of the LUT output register are preferably also used to control shift register operations.

From the foregoing it will be seen that the circuitry of this invention has a number of advantages. The invention adds little circuitry to existing LUT structure to implement a clearable, variable-length shift register. Because of its unique implementation, the circuitry lends itself to useful applications that a normal shift register does not. Specialized logic functions can be realized using this shift register scheme. One example is a Gray code subtractor. Another example is efficient FIFO memories, which ordinarily require costly dual-port memories. FIFO memories are easily implemented with the present shift register logic modules due to the Gray-code ordering and cascade features. See commonly assigned, concurrently filed U.S. patent application Ser. No. 09/761,609 for additional information regarding such possible uses as a Gray code subtractor and FIFO memories. This reference is hereby incorporated by reference herein in its entirety.

Figure 6:
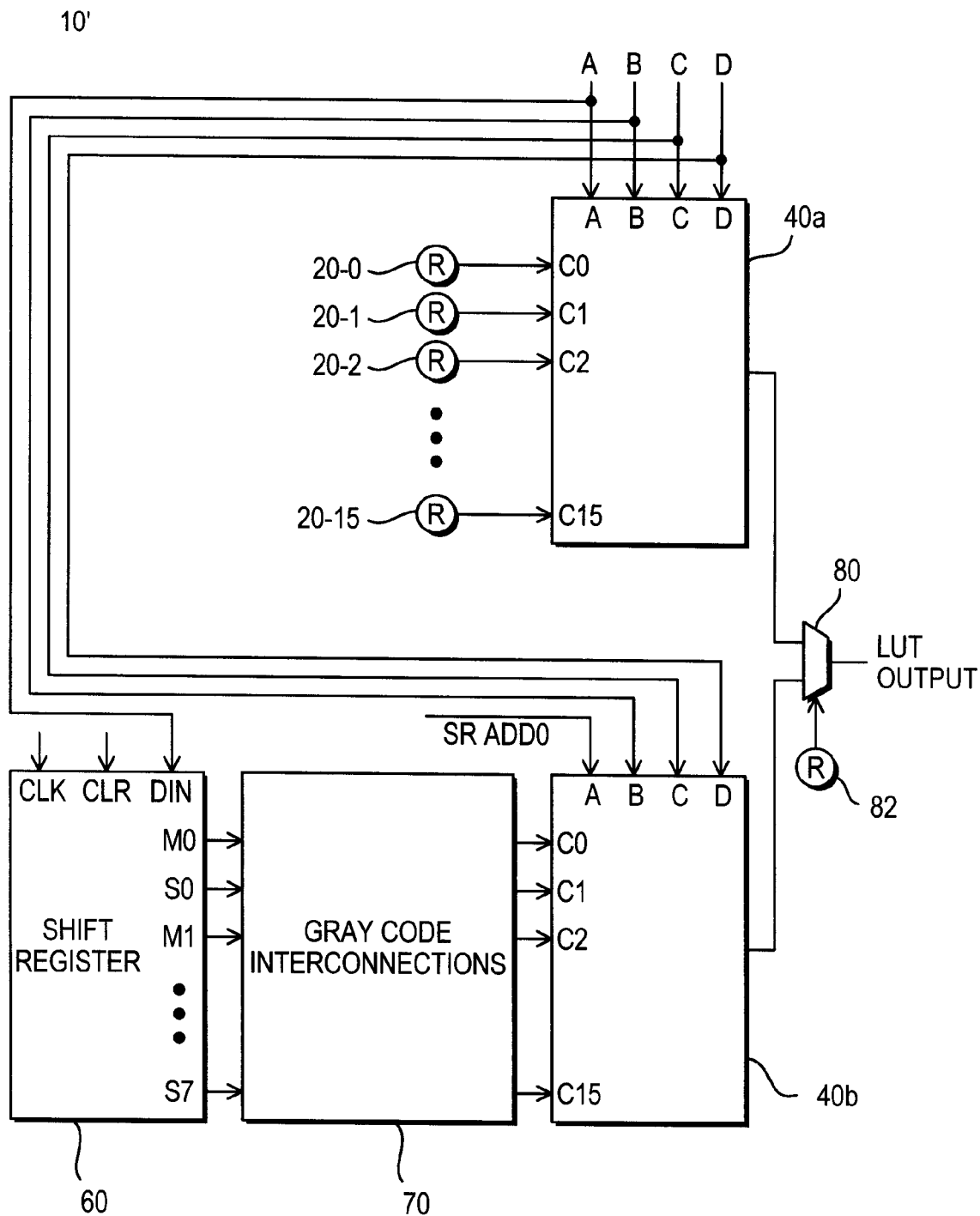
FIG. 6 is a simplified schematic block diagram of an alternative embodiment of a portion of a representative programmable logic device logic module constructed in accordance with the invention.

FIG. 6 shows an alternative embodiment of logic module circuitry 10' in accordance with the invention. In circuitry 10' two circuits 40a and 40b—each similar to circuitry 40 in FIG. 1—are provided. Circuit 40a makes a selection from the outputs of RAM bits 20-0 through 20-15 (similar to RAM bits 20-0 through 20-15 in FIG. 1) in response to inputs A–D. As in FIG. 1, signal source A also provides the DIN signal to shift register 60, which is similar to shift register 60 in FIG. 1. The outputs of shift register 60 are connected to the C0–C15 inputs of circuit 40b via a pattern of interconnections 70 similar to the pattern used between elements 40 and 60 in FIG. 1, but without the need for FCEs 26. Thus interconnections 70 preferably reflect a Gray code. Circuit 40b makes a selection from the signals received via interconnections 70 in response to inputs SR ADD0 and B–D. PLC 80 selects the LUT OUTPUT signal from the output signals of circuits 40a and 40b based on the programmed state of FCE 82.

Although the embodiment shown in FIG. 6 includes duplication of circuitry 40 from FIG. 1, it eliminates the need for the 16 PLCs 26 in FIG. 1. Thus the embodiment shown in FIG. 6 may be usable in some cases as an alternative to the FIG. 1 embodiment.

Figure 7:
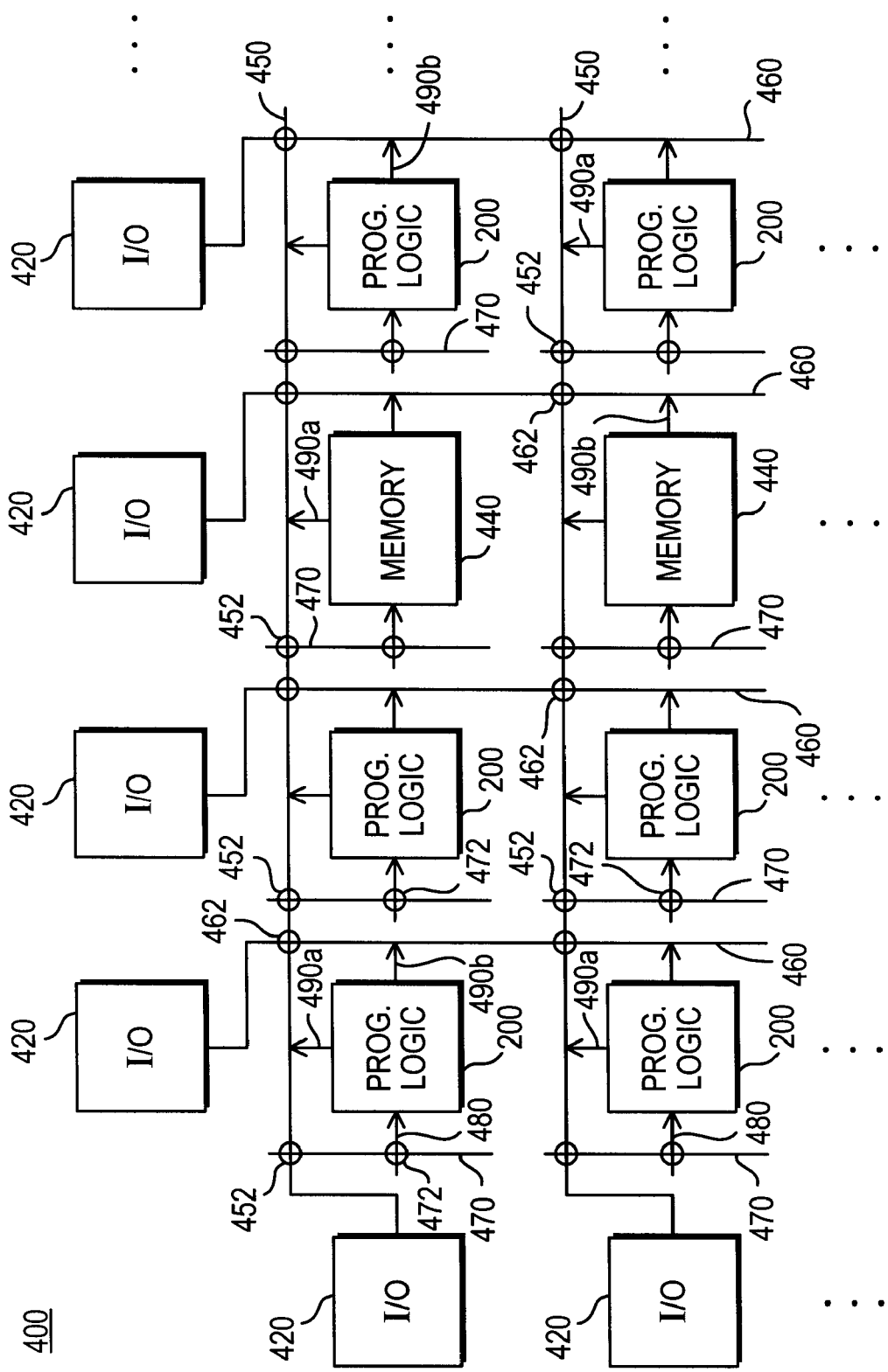
FIG. 7 is a simplified schematic block diagram of an illustrative programmable logic device which can be constructed in accordance with the invention.

FIG. 7 shows an illustrative programmable logic device 400 which can be constructed using logic modules 10 and other features in accordance with this invention. (All further references to "logic modules 10" will be understood to include the alternative 10' of FIG. 6.) Programmable logic device 400 includes a two-dimensional array of intersecting rows and columns of blocks 200 of programmable logic (see the earlier FIGS. for details of illustrative construction of a typical block 200). Each row may also include a relatively large block 440 of programmable memory. Memory blocks 440 are disposed on device 400 in a column. Blocks 420 of input/output circuitry and pads are disposed adjacent each end of each row and column of blocks 200/440. Horizontal interconnection conductors 450 are associated with each row of blocks 420/200/440. Vertical interconnection conductors 460 are associated with each column of blocks 420/200 or 420/440. Block-feeding conductors 470 are associated with each block 200/440 for bringing signals from horizontal conductors 450 to the associated block 200 or 440. Input conductors 480 associated with each block 200 or 440 deliver signals (e.g., the input signals A–D of each logic module 10) from the associated conductors 470 to that block 200 or 440. Output conductors 490a output signals (e.g., the LE OUTPUTS of each logic module 10) from each block 200 or 440 to adjacent conductors 450. Output conductors 490b similarly output signals from each block 200 or 440 to adjacent conductors 460. PLCs 452 are provided to selectively interconnect intersecting conductors 450 and 470. PLCs 462 similarly selectively interconnect intersecting conductors 450 and 460, and PLCs 472 similarly selectively interconnect intersecting conductors 470 and 480.

Each of blocks 200/440 is programmable to perform one or more relatively simple logic, shift register, and/or memory tasks on signals applied to that block via the associated conductors 480. The output signals that result are output via conductors 490. More complex logic, shift register, and/or memory tasks can be performed by concatenating multiple blocks 200/440 via the interconnection resources (e.g., 450, 452, 460, 462, 470, 472, 480, 490) of device 400. Signals can be input to or output from device 400 via I/O blocks 420.

It will be understood that FIG. 7 shows only one possible "architecture" of programmable logic devices in which the present invention can be used, and that the invention is equally usable in many other programmable logic device architectures.

Figure 8:
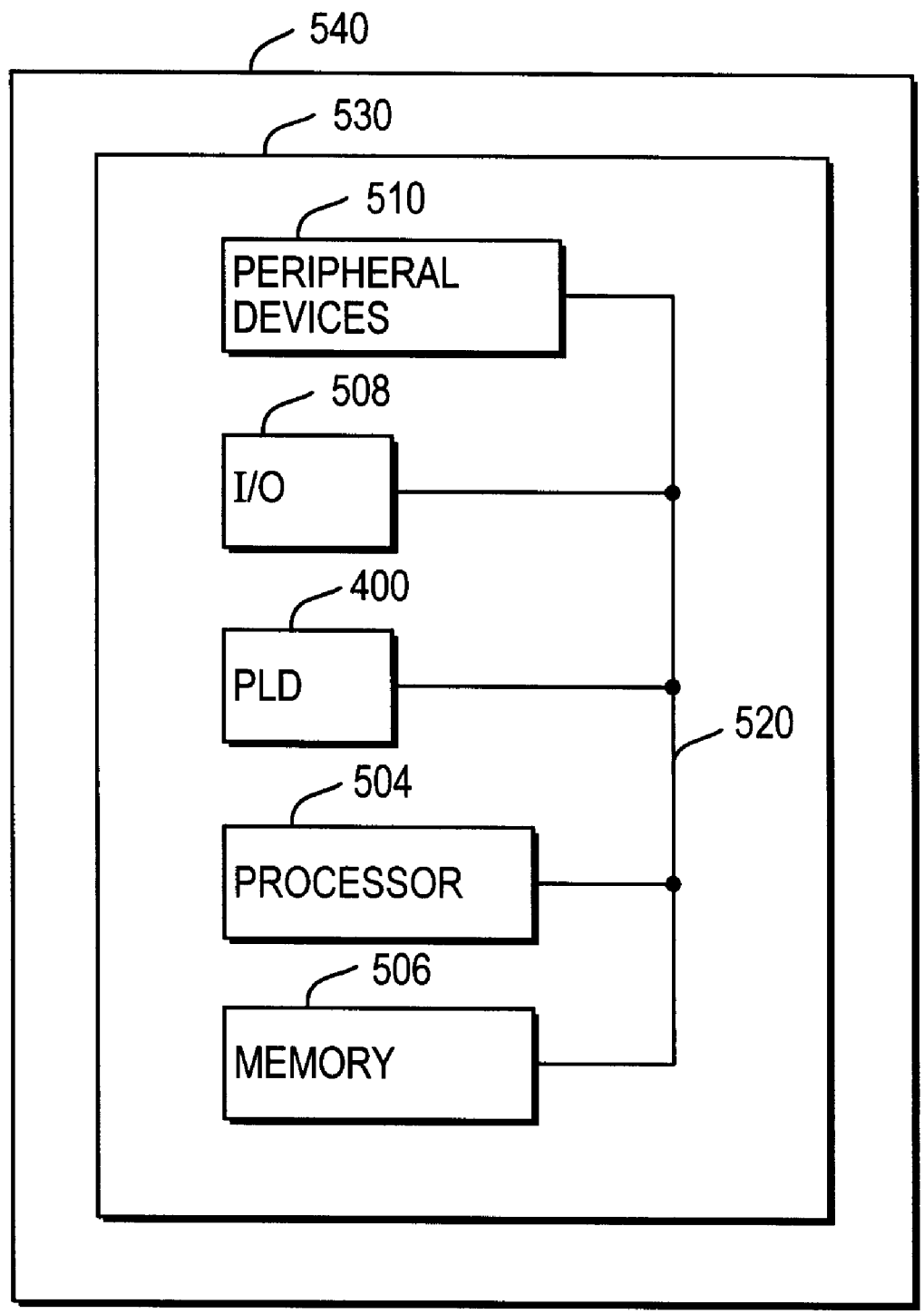
FIG. 8 is a simplified block diagram of an illustrative system employing a programmable logic device in accordance with the invention.

FIG. 8 illustrates a programmable logic device 400 of this invention in a data processing system 502. Data processing system 502 may include one or more of the following components: a processor 504; memory 506; I/O circuitry 508; and peripheral devices 510. These components are coupled together by a system bus 520 and are populated on a circuit board 530 which is contained in an end-user system 540.

System 502 can be used in a wide variety of applications, such as computer networking, data networking, instrumentation, video processing, digital signal processing, or any other application where the advantage of using programmable or reprogrammable logic is desirable. Programmable logic device 400 can be used to perform a variety of different logic functions. For example, programmable logic device 400 can be configured as a processor or controller that works in cooperation with processor 504. Programmable logic device 400 may also be used as an arbiter for arbitrating access to a shared resource in system 502. In yet another example, programmable logic device 400 can be configured as an interface between processor 504 and one of the other components in system 502. It should be noted that system 502 is only exemplary, and that the true scope and spirit of the invention should be indicated by the following claims.

Various technologies can be used to implement programmable logic devices 400 having the features of this invention, as well as the various components of those devices (e.g., the above-described PLCs and the FCEs that control the PLCs). For example, each PLC can be a relatively simple programmable connector such as a switch or a plurality of switches for connecting any one of several inputs to an output. Alternatively, each PLC can be a somewhat more complex element that is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the various components of PLCs can be controlled by various, programmable, function control elements ("FCEs"). (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the forgoing is only illustrative of the principles of this invention, and that various modifications can be made by those skilled in the art without departing from the scope and spirit of the invention. For example, the numbers of the various types of resources on device 400 can be different from the numbers present in the depicted and described illustrative embodiments. This applies to such parameters as the number of stages in each shift register circuitry 60, the number of logic modules 10 in each block 200, the number of blocks 200 in each row and column on programmable logic device 400, the numbers of the various types of conductors and connectors on device 400, etc.

What is claimed is:

1. A logic module for use in a programmable logic device comprising:
   look-up table selection control circuitry;
   shift register circuitry; and
   interconnection circuitry connecting the shift register circuitry to the look-up table selection control circuitry in a Gray-code order.

2. The logic module defined in claim 1 further comprising:
   a plurality of memory circuits; and
   switching circuitry configured to allow the look-up table selection control circuitry to alternatively access the shift register circuitry and the memory circuits.

3. The logic module defined in claim 1 further comprising:
   a plurality of memory circuits;

additional selection control circuitry connected to the memory circuits; and output selection circuitry configured to select either one of the look-up table selection control circuitry and the additional selection control circuitry as a source of an output signal.

4. The logic module defined in claim 1 further comprising:

clear circuitry configured to clear all stages of the shift register circuitry in parallel.

5. The logic module defined in claim 1 wherein each stage of the shift register circuitry includes a master latch circuit connected in series to feed a slave latch circuit, which is connected in series to feed the master latch circuit of a next successive stage of the shift register.

6. The logic module defined in claim 5 wherein the interconnection circuitry connects each master and slave latch circuit of the shift register to the look-up table selection control circuitry in a Gray-code order.

7. The logic module defined in claim 5 wherein each master and slave latch circuit has an output circuit configured to provide an output signal having the same polarity as the output circuit of the preceding latch circuit when data is fed to the latch circuit from the preceding latch circuit.

8. The logic module defined in claim 1 further comprising:

a final shift register stage output connection usable in parallel with the look-up table selection control circuitry.

9. Programmable logic circuitry comprising:

first and second logic modules, each as defined in claim 8; and cascade connection circuitry configured to connect the final shift register stage output connection of the first logic module to a data input of the shift register of the second logic module.

10. The programmable logic circuitry defined in claim 9 further comprising:

selection circuitry configured to allow an output signal of the look-up table selection control circuitry of either of the first and second logic modules to be output.

11. The logic module defined in claim 1 further comprising:

a data input terminal of the shift register circuitry connected to an address input lead of the look-up table selection control circuitry.

12. The logic module defined in claim 11 wherein the address input lead to which the data input terminal is connected is a low order address input lead.

13. The logic module defined in claim 11 further comprising:

substitute address signal circuitry configured to supply a substitute address signal to the address input lead when the shift register circuitry is being used.

14. The logic module defined in claim 13 wherein the substitute address signal circuitry is at least partly shared with at least one other similar logic module.

15. The logic module defined in claim 14 wherein the logic module and the other similar logic module each include programmable inversion circuitry configured to selectively invert a signal from the substitute address circuitry.

16. A digital processing system comprising:

processing circuitry;

a memory coupled to said processing circuitry; and a programmable logic integrated circuit device including a logic module as defined in claim 1 coupled to the processing circuitry and the memory.

17. A printed circuit board on which is mounted a programmable logic integrated circuit device including a logic module as defined in claim 1.

18. The printed circuit board defined in claim 17 further comprising:

a memory mounted on the printed circuit board and coupled to the programmable logic integrated circuit device.

19. The printed circuit board defined in claim 17 further comprising:

processing circuitry mounted on the printed circuit board and coupled to the programmable logic integrated circuit device.

20. A logic module for use in a programmable logic device comprising:

look-up table selection control circuitry;

shift register circuitry; and interconnection circuitry connecting the shift register circuitry to the look-up table selection control circuitry so that the look-up table selection control circuitry selects successive shift register output signals in response to successive Gray-coded selection control signals applied to the look-up table selection control circuitry.

21. The logic module defined in claim 20 further comprising:

a plurality of memory circuits; and switching circuitry configured to allow the look-up table selection control circuitry to alternatively access the shift register circuitry and the memory circuits.

22. The logic module defined in claim 20 further comprising:

a plurality of memory circuits;

additional selection control circuitry connected to the memory circuits; and output selection circuitry configured to select either one of the look-up table selection control circuitry and the additional selection control circuitry as a source of an output signal.

23. A logic module for use in a programmable logic device comprising:

look-up table selection control circuitry;

shift register circuitry including a plurality of master latch circuits connected in a series via interspersed slave latch circuits; and interconnection circuitry connecting the master and slave latch circuits to the look-up table selection control circuitry in Gray-code order.

24. The logic module defined in claim 23 further comprising:

a plurality of memory circuits; and routing circuitry configured to allow the look-up table selection control circuitry to alternatively access the master and slave latch circuits and the memory circuits.

25. The logic module defined in claim 23 further comprising:

a plurality of memory circuits;

additional selection control circuitry connected to the memory circuits; and output selection circuitry configured to select either one of the look-up table selection control circuitry and the additional selection control circuitry as a source of an output signal.

26. The logic module defined in claim 23 further comprising:

clear circuitry configured to clear all of the master and slave latch circuits in parallel.

27. The logic module defined in claim 23 wherein each master and slave latch circuit is configured to provide an output signal to the interconnection circuitry having the same polarity as the preceding master or slave latch circuit when the master or slave latch receives data from the preceding master or slave latch circuit.

28. The logic module defined in claim 23 further comprising:

a final slave latch circuit output connection usable in parallel with the interconnection circuitry connections to the look-up table selection control circuitry.

29. Programmable logic circuitry comprising:

first and second logic modules, each as defined in claim 28; and cascade connection circuitry configured to connect the final slave latch circuit output connection of the first logic module to a data input of a first master latch circuit of the second logic module.

30. The programmable logic circuitry defined in claim 29 further comprising:

selection circuitry configured to select an output signal of the look-up table selection control circuitry of either of the first and second logic modules for application to a common node.

31. The logic module defined in claim 23 further comprising:

a data input terminal of a first of the master latch circuits connected to an address input lead of the look-up table selection control circuitry.

32. The logic module defined in claim 31 wherein the address input lead to which the data input terminal is connected is a least significant address input lead.

33. The logic module defined in claim 31 further comprising:

substitute address signal circuitry configured to supply a substitute address signal to the address input lead when the shift register circuitry is being used.

34. The logic module defined in claim 33 wherein the substitute address signal circuitry is at least partly shared with at least one other similar logic module.

35. The logic module defined in claim 34 wherein the logic module and the other similar logic module each include programmable inversion circuitry configured to selectively invert a signal from the substitute address circuitry.

36. Programmable logic device circuitry comprising:

a plurality of logic module circuits, each including shift register circuitry shifting data in response to a clock signal;

first and second clock signal conductors;

first and second clock signal sources;

routing circuitry configured to apply signals from the first and second clock signal sources to the first and second clock signal conductors, respectively, and alternatively to apply the signal from the first clock signal source to the first clock signal conductor and to apply an inversion of the signal from the first clock signal source to the second clock signal conductor; and selection circuitry associated with each of the logic modules and configured to select either of the first and second clock signal conductors to provide the clock signal for the associated logic module.

37. The programmable logic device circuitry defined in claim 36 further comprising:

first and second enable signal sources; and first and second gate circuits configured to respectively pass the signals from the first and second clock signal sources to the routing circuitry when respectively enabled by signals from the first and second enable signal sources.

* * * * *